United States Patent
Ikeno et al.

(10) Patent No.: US 9,406,694 B1
(45) Date of Patent: Aug. 2, 2016

(54) SEMICONDUCTOR DEVICE AND METHOD FOR MANUFACTURING THE SAME

(71) Applicant: KABUSHIKI KAISHA TOSHIBA, Tokyo (JP)

(72) Inventors: Daisuke Ikeno, Mie (JP); Masayuki Kitamura, Mie (JP); Atsuko Sakata, Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/844,036

(22) Filed: Sep. 3, 2015

(30) Foreign Application Priority Data

May 29, 2015 (JP) .................. 2015-109470

(51) Int. Cl.
*H01L 29/792* (2006.01)
*H01L 27/115* (2006.01)
*H01L 29/51* (2006.01)
*H01L 29/49* (2006.01)
*H01L 29/66* (2006.01)
*H01L 21/306* (2006.01)
*H01L 21/764* (2006.01)
*H01L 21/28* (2006.01)
*H01L 21/283* (2006.01)
*H01L 29/45* (2006.01)

(52) U.S. Cl.
CPC ........ *H01L 27/11582* (2013.01); *H01L 21/283* (2013.01); *H01L 21/28282* (2013.01); *H01L 21/30604* (2013.01); *H01L 21/764* (2013.01); *H01L 27/11565* (2013.01); *H01L 27/11568* (2013.01); *H01L 29/45* (2013.01); *H01L 29/495* (2013.01); *H01L 29/512* (2013.01); *H01L 29/517* (2013.01); *H01L 29/518* (2013.01); *H01L 29/66833* (2013.01); *H01L 29/7926* (2013.01)

(58) Field of Classification Search
CPC .................. H01L 27/11582; H01L 21/28282; H01L 21/764; H01L 21/283; H01L 21/30604
USPC ......................................... 257/324
See application file for complete search history.

(56) References Cited

U.S. PATENT DOCUMENTS

| | | | |
|---|---|---|---|
| 5,903,053 A | 5/1999 | Iijima et al. | |
| 7,612,403 B2 | 11/2009 | Bhattacharyya | |
| 8,058,681 B2 | 11/2011 | Shingu et al. | |
| 8,110,497 B2 * | 2/2012 | Sakata ............... | H01L 21/2885 257/E21.582 |
| 8,115,249 B2 | 2/2012 | Kamioka et al. | |
| 8,294,195 B2 | 10/2012 | Shingu et al. | |
| 8,704,290 B2 | 4/2014 | Shingu et al. | |
| 8,987,809 B2 | 3/2015 | Shingu et al. | |

(Continued)

*Primary Examiner* — Theresa T Doan
(74) *Attorney, Agent, or Firm* — Finnegan, Henderson, Farabow, Garrett & Dunner, LLP

(57) ABSTRACT

According to one embodiment, a semiconductor device includes a metal layer containing boron, a semiconductor film extending in a direction intersecting with a direction in which the metal layer extends, a charge storage film provided between the semiconductor film and the metal layer, a first dielectric film provided between the charge storage film and the metal layer, and a nitride film provided between the first dielectric film and the metal layer. The nitride film includes a first titanium nitride film provided in contact with the first dielectric film, a second titanium nitride film provided in contact with the metal layer, and an amorphous nitride film provided between the first titanium nitride film and the second titanium nitride film.

12 Claims, 17 Drawing Sheets

(56) References Cited

U.S. PATENT DOCUMENTS

| | | |
|---|---|---|
| 9,012,978 B2 | 4/2015 | Shingu et al. |
| 2010/0034023 A1 | 2/2010 | Shingu et al. |
| 2010/0140682 A1 | 6/2010 | Kamioka et al. |
| 2012/0032248 A1 | 2/2012 | Shingu et al. |
| 2013/0010535 A1 | 1/2013 | Shingu et al. |
| 2013/0056873 A1* | 3/2013 | Wada .................. H01L 23/5226 257/746 |
| 2013/0343122 A1 | 12/2013 | Shingu et al. |
| 2014/0001536 A1 | 1/2014 | Shingu et al. |
| 2015/0187792 A1 | 7/2015 | Shingu et al. |
| 2015/0194520 A1 | 7/2015 | Shingu et al. |

* cited by examiner

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2015-109470, filed on May 29, 2015; the entire contents of which are incorporated herein by reference.

FIELD

Embodiments described herein relate generally to a semiconductor device and a method for manufacturing the same.

BACKGROUND

A memory device of three-dimensional structure has been proposed. The memory device includes a stacked body including a plurality of electrode layers being stacked between insulating layers. A charge storage film and a semiconductor film are provided in the stacked body, and extend in a stacking direction of the stacked body.

Tungsten and molybdenum are studied as a material of the electrode layer of such a three-dimensional memory device. Tungsten and molybdenum may contain boron in film formation. In a following heat treatment process, the boron is diffused to the insulating layer near the electrode layer, which may cause a deterioration in the characteristics of the insulating layer.

DETAILED DESCRIPTION

Figure 1:
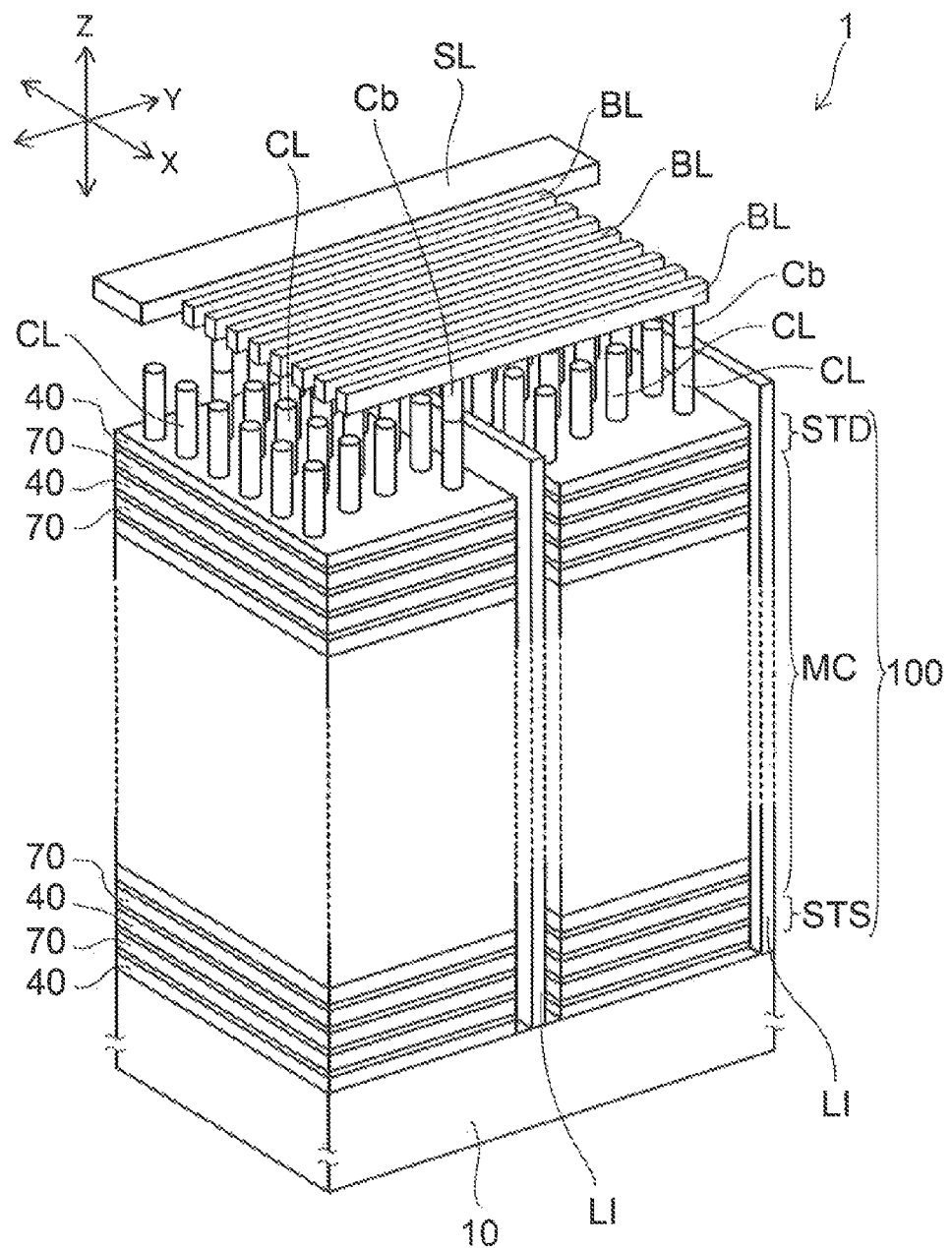
FIG. 1 is a schematic perspective view of a semiconductor device of an embodiment.

According to one embodiment, a semiconductor device includes a metal layer containing boron, a semiconductor film extending in a direction intersecting with a direction in which the metal layer extends, a charge storage film provided between the semiconductor film and the metal layer, a first dielectric film provided between the charge storage film and the metal layer, and a nitride film provided between the first dielectric film and the metal layer. The nitride film includes a first titanium nitride film provided in contact with the first dielectric film, a second titanium nitride film provided in contact with the metal layer, and an amorphous nitride film provided between the first titanium nitride film and the second titanium nitride film.

Embodiments will be described below with reference to drawings. Note that the same reference numerals are applied for the same elements in each drawing.

The semiconductor device of the embodiment is a semiconductor memory device.

FIG. 1 is a schematic perspective view of a memory array 1 of the semiconductor memory device of the embodiment. In FIG. 1, two mutually orthogonal directions parallel to a major surface of a substrate 10 are defined as an X direction (a first direction) and a Y direction (a second direction), and a direction orthogonal to both the X direction and the Y direction is defined as a Z direction (a third direction or a stacking direction).

The memory array 1 includes the substrate 10, a stacked body 100 provided on the major surface of the substrate 10, a plurality of columns CL, a conductive member LI, and upper layer interconnection provided above the stacked body 100. In FIG. 1, bit lines BL and a source layer SL are illustrated as the upper layer interconnection.

The column CL is formed in a cylindrical pillar shape or an elliptical pillar shape that extends in the stacking direction (the Z direction) inside the stacked body 100. The conductive member LI extends in the stacking direction (the Z direction) of the stacked body 100 and the X direction between the upper layer interconnection and the substrate 10, and separates the stacked body in the Y direction.

The plurality of columns CL are disposed in a staggered arrangement, for example. Alternatively, the plurality of columns CL may be disposed in a square lattice arrangement along the X direction and the Y direction.

The plurality of bit lines (for example, metal films) BL are provided above the stacked body 100. The plurality of bit lines BL are separated from each other in the X direction, and each of the bit lines BL extends in the Y direction.

A top end section of the column CL is connected to the bit line BL via a contact part Cb. The plurality of columns CL, one each selected from each of areas (blocks) separated in the Y direction by the conductive member LI, are commonly connected to one of the bit lines BL.

Figure 2:
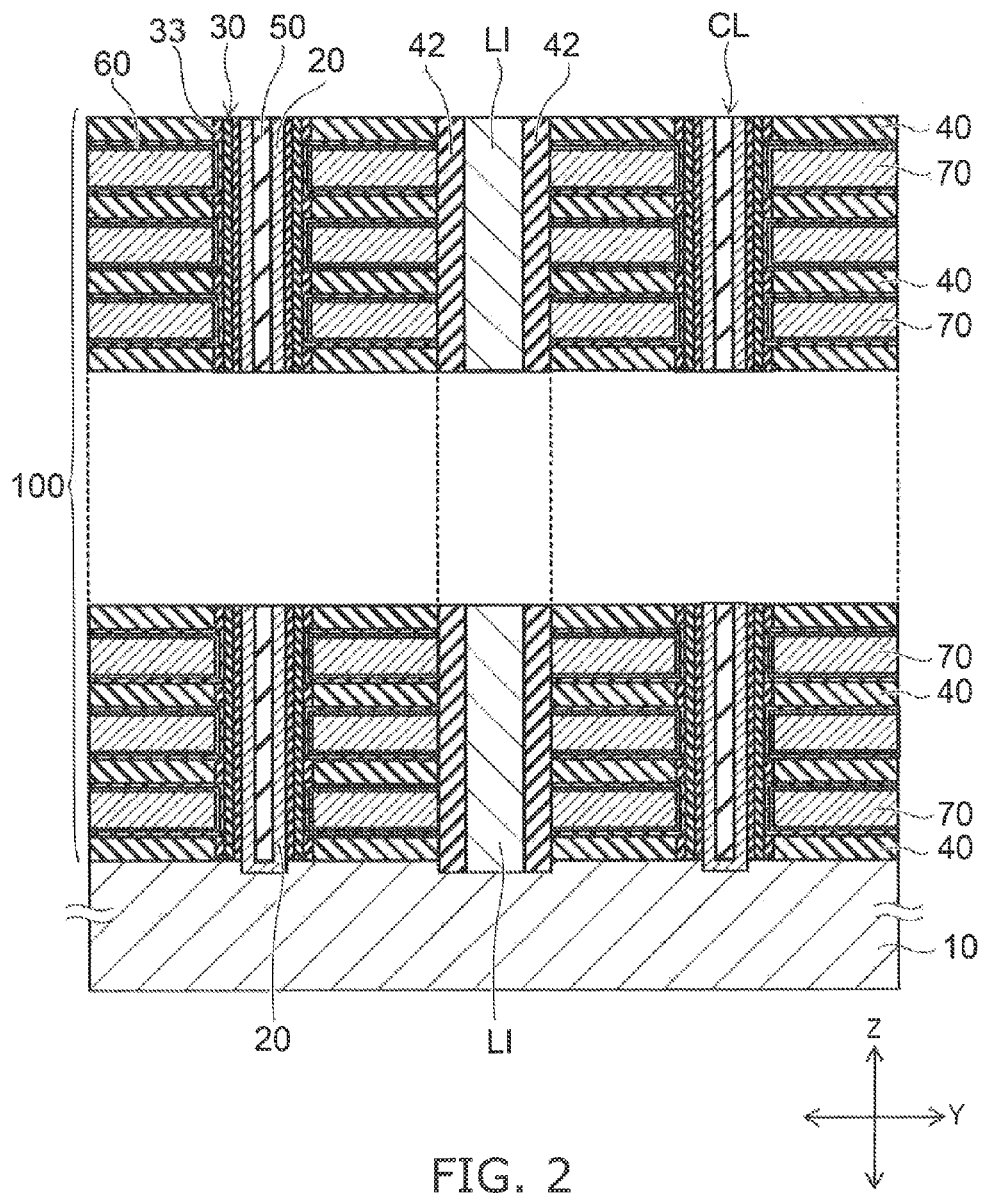
FIG. 2 is a schematic cross-sectional view of the semiconductor device of the embodiment.

FIG. 2 is a schematic cross-sectional view of the stacked body 100, the columns CL and the conductive member LI. FIG. 2 illustrates a cross section parallel to a Y-Z plane in FIG. 1.

The stacked body 100 includes a plurality of metal layers 70 and a plurality of insulating layers 40 that are stacked on the major surface of the substrate 10. The plurality of metal layers 70 are stacked in the Z direction at predetermined intervals between the insulating layers 40.

The metal layer 70 contains at least one of tungsten (W) and molybdenum (Mo). The metal layer 70 is a tungsten layer containing tungsten as a major component or a molybdenum layer containing molybdenum as a major component.

As will be described later, the metal layer 70 is formed by chemical vapor deposition (CVD). At that time, for example, boron (B) which is one of elements that derives from a reducing source gas is contained in the metal layer 70.

The insulating layer 40, for example, contains silicon oxide ($SiO_2$) as a major component. Alternatively, an air gap may be formed between the metal layers 70 vertically adjacent to each other, and the air gap may function as the insulating layer 40.

Figure 3:
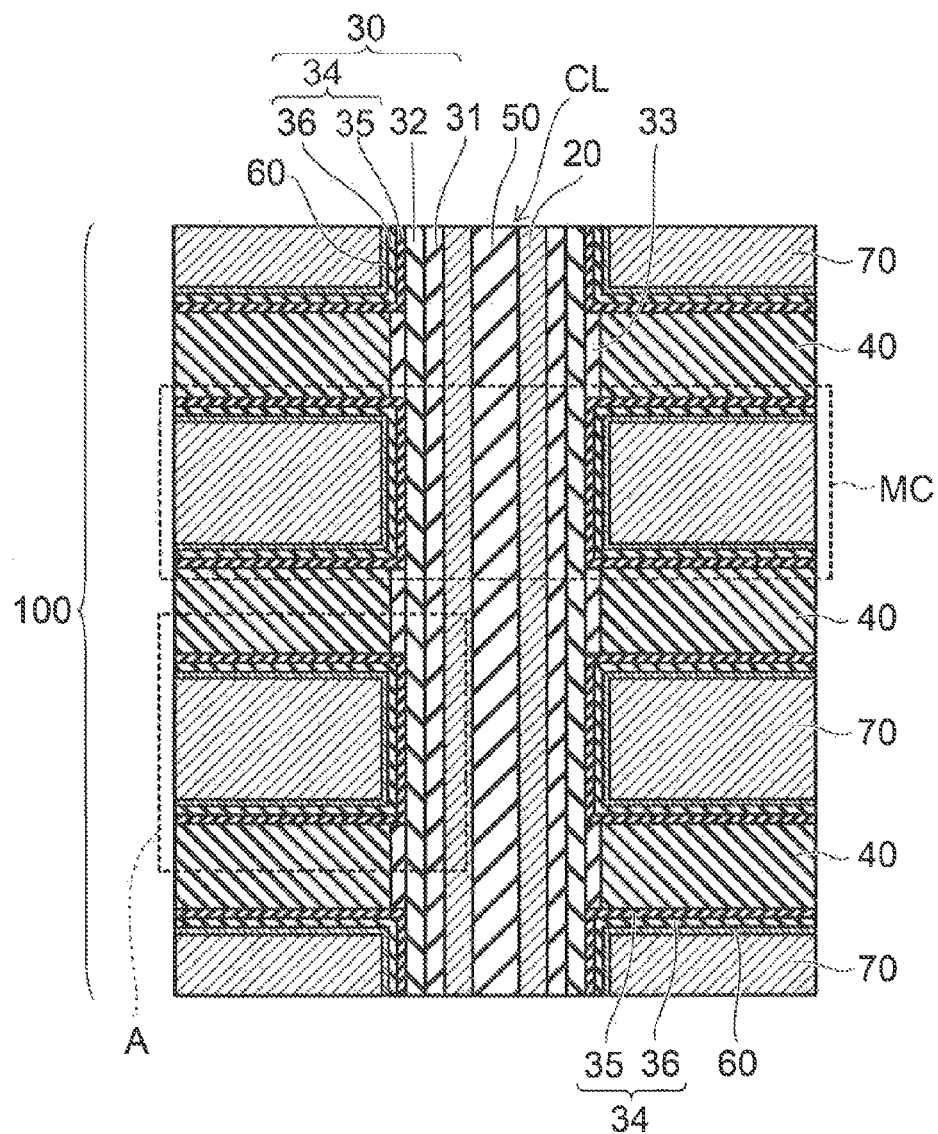
FIG. 3 is an enlarged cross-sectional view of a section in FIG. 2.

FIG. 3 is an enlarged cross-sectional view of a section in FIG. 2.

Figure 4:
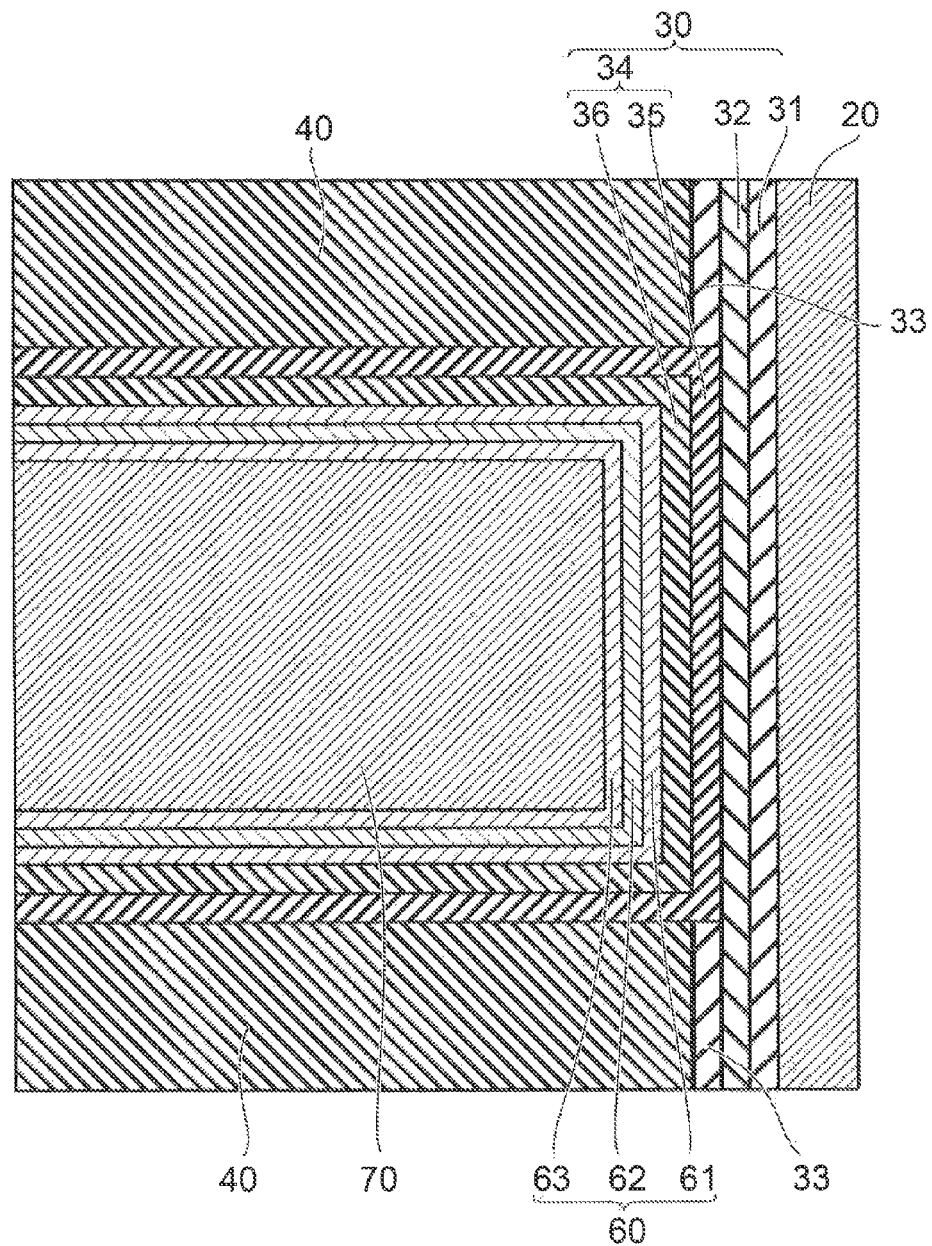
FIG. 4 is an enlarged cross-sectional view of a section A in FIG. 3.

FIG. 4 is an enlarged cross-sectional view of a section A in FIG. 3.

The column CL includes a memory film 30, a semiconductor film 20, and a core dielectric film 50. The semiconductor film 20 extends in a tubular shape in the stacking direction (the Z direction) inside the stacked body 100. The memory film 30 is provided between the metal layer 70 and the semiconductor film 20, and surrounds the semiconductor film 20 from the outer peripheral side of the semiconductor film 20. The core dielectric film 50 is provided on the inner side of the tubular shaped semiconductor film 20. A top end section of the semiconductor film 20 is electrically connected to the bit line BL via the contact part Cb illustrated in FIG. 1.

The memory film 30 includes a block dielectric film 34 as a first dielectric film, a charge storage film 32, and a tunnel dielectric film 31 as a second dielectric film. The charge storage film 32, the tunnel dielectric film 31, and the semiconductor film 20 continuously extend in the stacking direction of the stacked body 100. The block dielectric film 34, the charge storage film 32, and the tunnel dielectric film 31 are provided between the metal layer 70 and the semiconductor film 20, in that order from the metal layer 70 side.

The tunnel dielectric film 31 is in contact with the semiconductor film 20. The charge storage film 32 is provided between the block dielectric film 34 and the tunnel dielectric film 31.

The semiconductor film 20, the memory film 30, and the metal layer 70 configure a memory cell MC. In FIG. 3, the metal layer 70 extends in a depth direction on the paper (the X direction), the semiconductor film 20 extends in the stacking direction of the stacked body 100 (the Z direction), which is orthogonal to the X direction in which the metal layer 70 extends. The memory cell MC is formed at an intersecting part of the metal layer 70 and the semiconductor film 20. The memory cell MC has a vertical transistor structure in which the metal layer 70 surrounds the periphery of the semiconductor film 20 via the memory film 30.

In the memory cell MC having the vertical transistor structure, the semiconductor film 20 functions as a channel, and the metal layer 70 functions as a control gate (a control electrode). The charge storage film 32 functions as a data memory layer that stores an electric charge injected from the semiconductor film 20.

The semiconductor memory device of the embodiment is a non-volatile semiconductor memory device that can freely erase and write data electrically, and can retain the memory content even when the power is cut.

The memory cell MC is, for example, a charge trap type of memory cell. The charge storage film 32 has, in its dielectric film, multiple trap sites that capture an electric charge and includes a silicon nitride film, for example.

The tunnel dielectric film 31 functions as a potential barrier when a charge is injected from the semiconductor film 20 into the charge storage film 32, or when the charge stored in the charge storage film 32 is diffused to the semiconductor film 20. The tunnel dielectric film 31 includes a silicon oxide film or a silicon oxynitride film, for example.

The block dielectric film 34 inhibits the charge stored in the charge storage film 32 from being diffused to the metal layer 70. The block dielectric film 34 includes a first block film 35 and a second block film 36.

The first block film 35 is in contact with the charge storage film 32. The second block film 36 is provided between the first block film 35 and the metal layer 70 so as to be in contact with the first block film 35. The first block film 35 is a silicon oxide film, and the second block film 36 is a film having a higher dielectric constant than the silicon oxide film. This type of the second block film 36 suppresses back tunneling of electrons from the metal layer 70 in erasing operation.

The second block film 36 is an aluminum oxide film, for example. Alternatively, a hafnium oxide film, an yttrium oxide film, or a zirconium oxide film may be used as the second block film 36.

The block dielectric film 34 is further provided between the metal layer 70 and the insulating layer 40. The first block film 35 is in contact with a lower surface of an insulating layer 40 immediately above a metal layer 70 and in contact with an upper surface of another insulating layer 40 immediately below the metal layer 70. The second block film 36 is provided between the metal layer 70 and the first block film 35 provided on the lower surface of the insulating layer 40. The second block film 36 is provided between the metal layer 70 and the first block film 35 provided on the upper surface of the insulating layer 40.

The first block film 35 provided between the metal layer 70 and the charge storage film 32, and the first block film 35 provided between the metal layer 70 and the insulating layer 40 are integrally provided so as to be continuous to each other. The second block film 36 provided between the metal layer 70 and the charge storage film 32, and the second block film 36 provided between the metal layer 70 and the insulating layer 40 are integrally provided so as to be continuous to each other.

A nitride film 60 is provided between the metal layer 70 and the block dielectric film 34. As illustrated in FIG. 4, the nitride film 60 includes a first titanium nitride film 61, an amorphous nitride film 62, and a second titanium nitride film 63.

It is sufficient if the amorphous nitride film 62 and an amorphous nitride film 64 illustrated in FIG. 17 that will be described later are films in which, in diffraction measurement as represented by electron beam diffraction or X-ray diffraction, such as reflection high-energy electron diffraction (RHEED), a broad diffraction intensity, namely a halo peak, is observed, and diffraction lines from intermetallic compound fine crystals caused by incomplete amorphization may appear. Furthermore, the amorphous nitride films 62 and 64 need not be entirely amorphous, and the amorphous nitride films 62 and 64 may have a structure in which a section of a thin crystalline film becomes amorphous.

The amorphous nitride film 62 may be a silicon nitride film or an aluminum nitride film, for example. The first titanium nitride film 61 and the second titanium nitride film 63 are crystalline films having a plurality of crystal grains.

The first titanium nitride film 61 is in contact with the second block film 36, between the metal layer 70 and the charge storage film 32. The second titanium nitride film 63 is in contact with the side surface of the metal layer 70. The amorphous nitride film 62 is provided between the first titanium nitride film 61 and the second titanium nitride film 63 so as to be in contact with the first titanium nitride film 61 and the second titanium nitride film 63.

The nitride film 60 is further provided between the metal layer 70 and the insulating layer 40. Between the metal layer 70 and the insulating layer 40, the first titanium nitride film 61 is in contact with the second block film 36. The second titanium nitride film 63 is in contact with the upper surface and the lower surface of the metal layer 70.

The second titanium nitride film 63 is integrally and continuously provided on the upper surface, the side surface and the lower surface of the metal layer 70. The amorphous nitride film 62 is continuously provided via the second titanium nitride film 63 along the upper surface, the side surface and the lower surface of the metal layer 70. The first titanium nitride film 61 is continuously provided via the second titanium nitride film 63 and the amorphous nitride film 62 along the upper surface, the side surface and the lower surface of the metal layer 70.

The nitride film 60 and the block dielectric film 34 are not provided between the insulating layer 40 and the charge storage film 32. A cover dielectric film (for example, a silicon oxide film) 33 is provided between the insulating layer 40 and the charge storage film 32.

As illustrated in FIG. 1, a drain-side select transistor STD is provided on the top end section of the column CL, and a source-side select transistor STS is provided on a bottom end section of the column CL. Among the plurality of metal layers 70, a lowermost metal layer 70, for example, functions as a control gate (a control electrode) of the source-side select transistor STS. Among the plurality of metal layers 70, an uppermost metal layer 70, for example, functions as a control gate (a control electrode) of the drain-side select transistor STD. Similarly to the memory cell MC, the drain-side select transistor STD and the source-side select transistor STS are vertical transistors through which an electric current flows in the stacking direction of the stacked body 100 (the Z direction).

A plurality of the memory cells MC are provided between the drain-side select transistor STD and the source-side select transistor STS. The plurality of the memory cells MC, the drain-side select transistor STD, and the source-side select transistor STS are serially connected through the semiconductor film 20 so as to configure a single memory string. The memory string is disposed in a staggered arrangement, for example, in a surface direction parallel to an X-Y plane, and the plurality of memory cells MC are provided in a three-dimensional manner in the X direction, the Y direction, and the Z direction.

As illustrated in FIG. 2, an dielectric film 42 is provided on both side walls in the Y direction of the conductive member LI that separates the stacked body 100 in the Y direction. The dielectric film 42 is provided between the stacked body 100 and the conductive member LI. The dielectric film 42 is not illustrated in FIG. 1.

The conductive member LI is, for example, a metal member containing tungsten as its major component. A top end section of the conductive member LI is connected to the source layer SL provided above the stacked body 100 and illustrated in FIG. 1. As illustrated in FIG. 2, a bottom end of the conductive member LI is in contact with the substrate 10. Furthermore, a bottom end of the semiconductor film 20 is in contact with the substrate 10. The substrate 10 is, for example, an impurity-doped silicon substrate having electrical conductivity. Therefore, the bottom end of the semiconductor film 20 is electrically connected to the source layer SL, via the substrate 10 and the conductive member LI.

Next, a method for manufacturing the semiconductor memory device of the embodiment will be described with reference to FIGS. 5 to 16.

Figure 5:
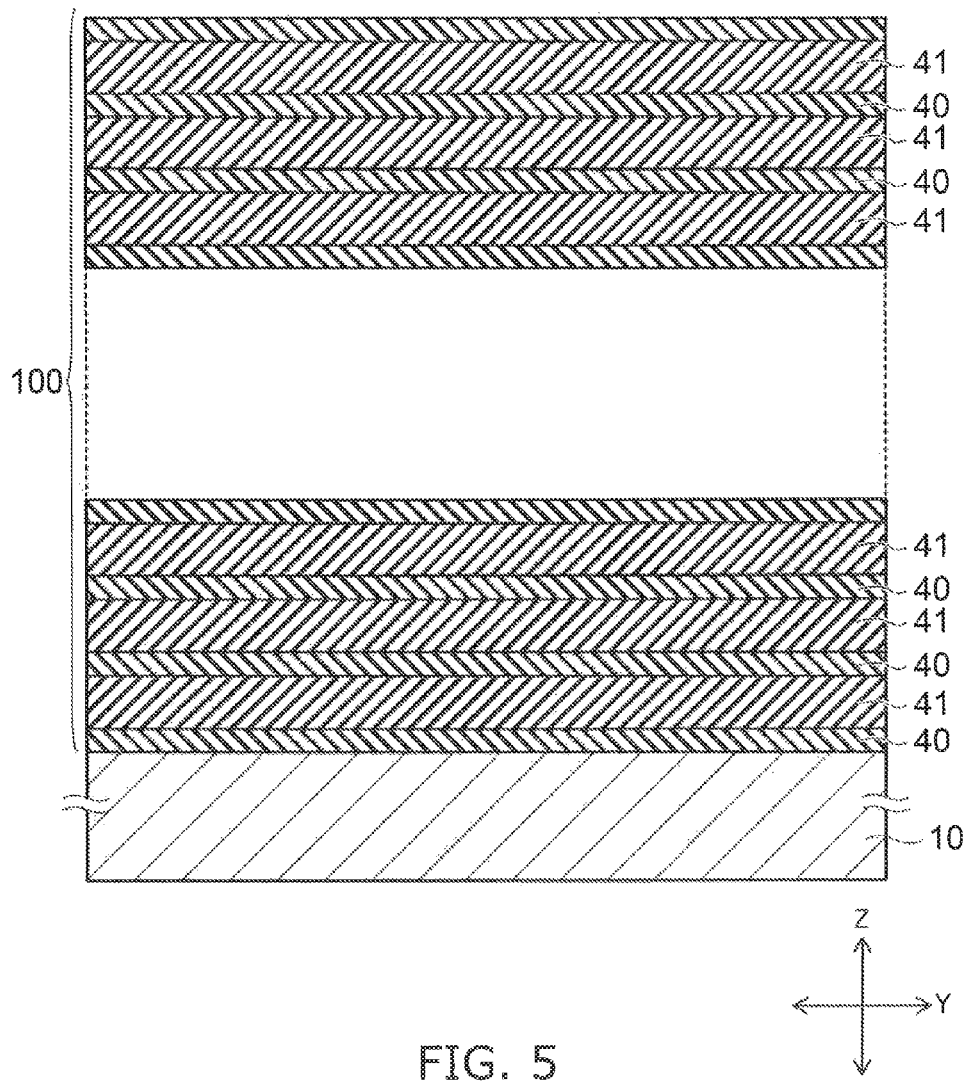
FIGS. 5 to 16 are schematic cross-sectional views showing a method for manufacturing the semiconductor device of the embodiment.

As illustrated in FIG. 5, the insulating layer 40 as a first layer is formed on the major surface of the substrate 10, and a sacrificial layer 41 as a second layer of a different material from that of the insulating layer 40 is formed on the insulating layer 40. Hereinafter, a process in which the insulating layer 40 and the sacrificial layer 41 are alternately stacked is repeated a plurality of times, and the stacked body 100 including a plurality of the insulating layers 40 and a plurality of the sacrificial layers 41 is formed on the substrate 10.

The substrate 10 is, for example, a single crystal silicon substrate. A silicon oxide film ($SiO_2$ film) is formed by chemical vapor deposition (CVD) as the insulating layer 40, for example. A silicon nitride film (SiN film) is formed by CVD as the sacrificial layer 41, for example. The sacrificial layer 41 is thicker than the insulating layer 40.

The sacrificial layer 41 is removed in a later process. The block dielectric film 34, the nitride film 60, and the metal layer 70 are formed in a space from which the sacrificial layer 41 has been removed.

Figure 6:
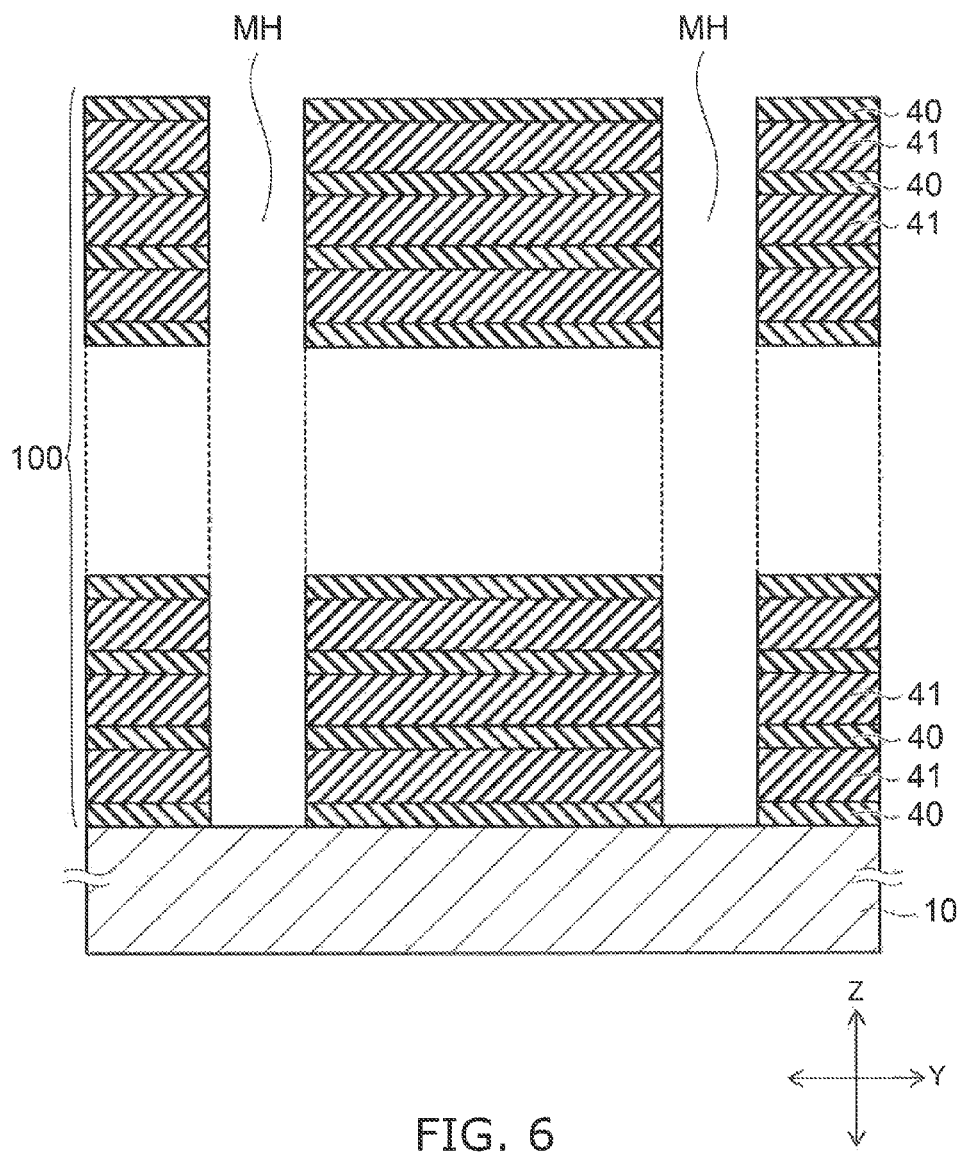

As illustrated in FIG. 6, a memory hole MH is formed in the stacked body 100. A plurality of memory holes MH are formed, for example, by reactive ion etching (RIE), using a mask (not illustrated). The memory hole MH extends in the stacking direction (the Z direction) of the stacked body 100, penetrates through the stacked body 100 and reaches the substrate 10.

Figure 7:
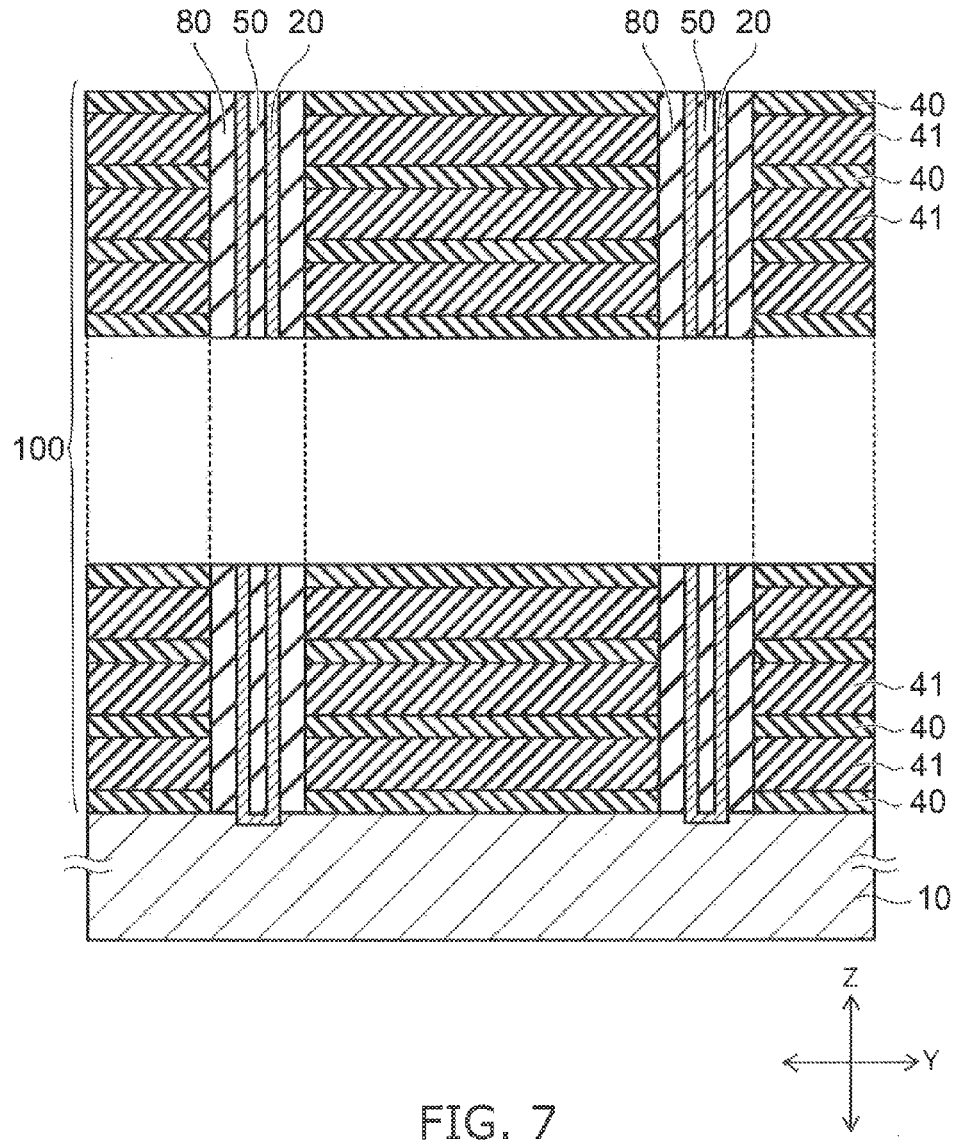
Figure 8:
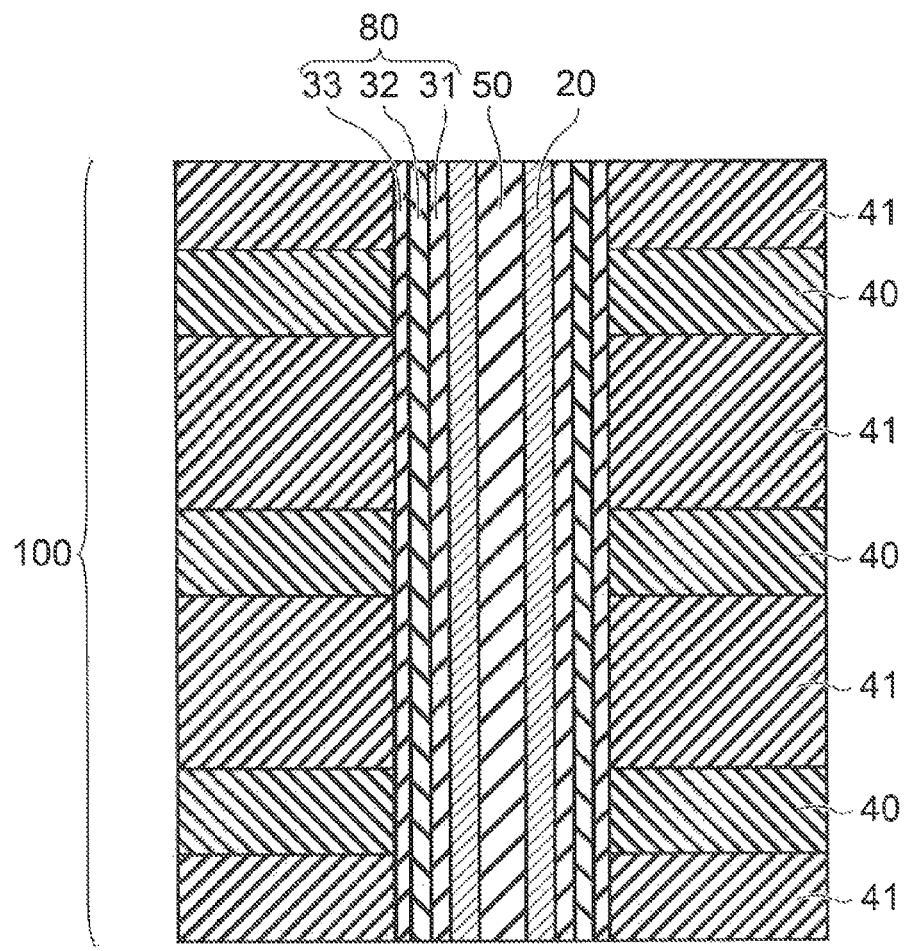

As illustrated in FIG. 7 and in FIG. 8 that is an enlarged view of a section of FIG. 7, a film 80, the semiconductor film 20, and the core dielectric film 50 are formed in the memory hole MH. As illustrated in FIG. 8, the film 80 includes the cover dielectric film 33, the charge storage film 32, and the tunnel dielectric film 31.

First, a silicon oxide film ($SiO_2$ film), for example, is formed on a side surface of the memory hole MH by atomic layer deposition (ALD) so as to be the cover dielectric film 33. The cover dielectric film 33 is further formed on the bottom of the memory hole MH. A silicon nitride film (SiN film), for example, is formed by ALD on the inner side of the cover dielectric film 33 so as to be the charge storage film 32, and the tunnel dielectric film 31 is further formed on the inner side of the charge storage film 32.

A process of forming the tunnel dielectric film 31 includes, for example, a process in which a silicon oxide film ($SiO_2$ film) is formed by ALD on the inner side of the charge storage film 32, and a process in which the silicon oxide film is reformed so as to be a silicon oxynitride film (SiON film) as a result of nitriding treatment.

A hollow space is left on the inner side of the film 80 including the cover dielectric film 33, the charge storage film 32, and the tunnel dielectric film 31. A part of the film 80 that has been deposited on the bottom of the memory hole MH at the bottom of the hollow space is removed by RIE, for example.

After that, the semiconductor film 20 is formed on a side surface of the film 80. As illustrated in FIG. 7, the semiconductor film 20 is further formed on the bottom of the memory hole MH, and is in contact with the substrate 10. A process of forming the semiconductor film 20 includes a process in which an impurity-doped amorphous silicon film is formed by CVD or ALD, for example, and a process in which the amorphous silicon film is subjected to heat treatment so as to be a polycrystalline silicon film.

A hollow space is left on the inner side of the semiconductor film 20, and a silicon oxide film ($SiO_2$ film), for example, is buried in the hollow space so as to be the core dielectric film 50.

Figure 9:
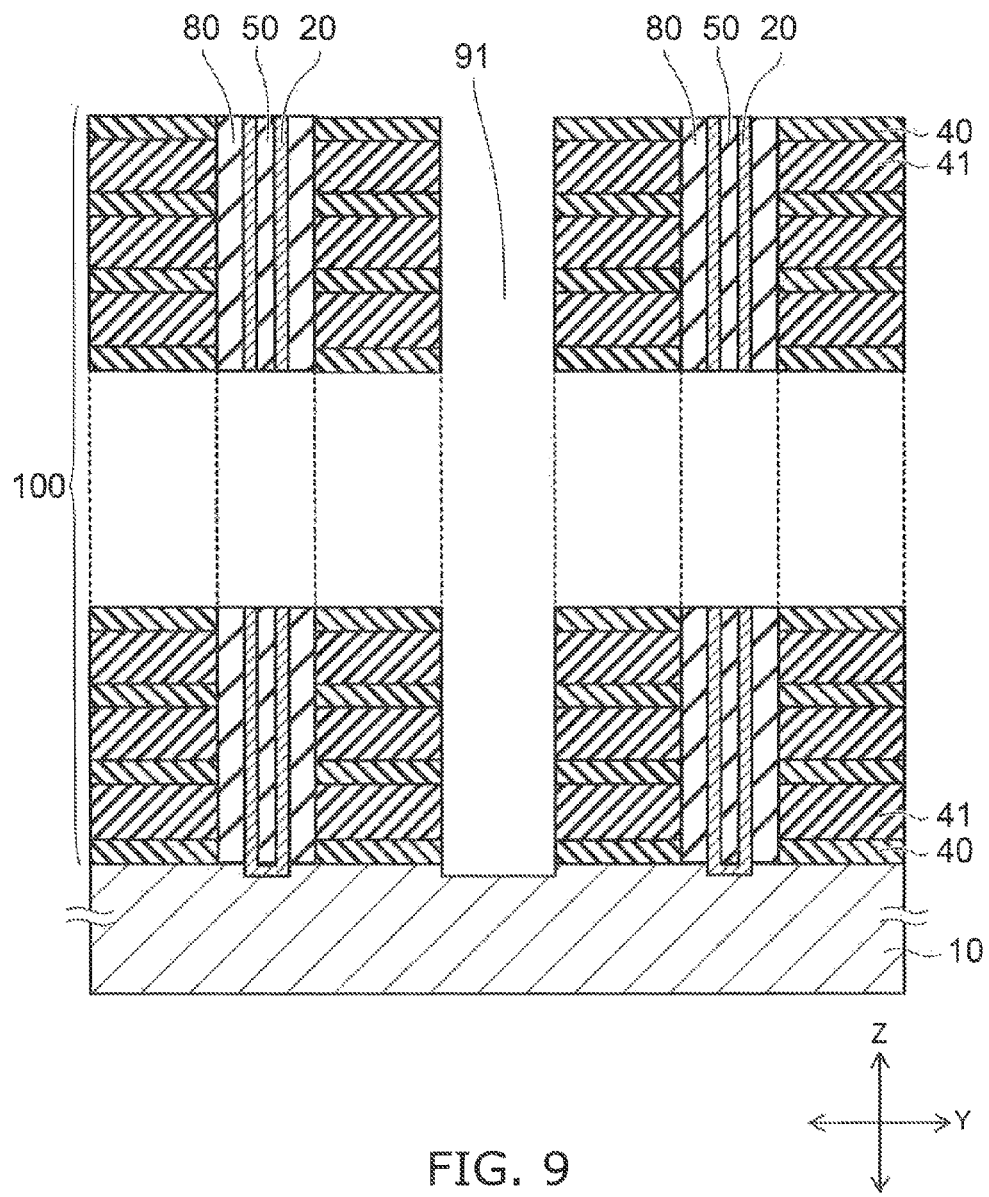

Next, as illustrated in FIG. 9, a slit (or a trench) 91 is formed in the stacked body 100. The slit 91 is formed, for example, by RIE using a mask (not illustrated). The slit 91 extends in the stacking direction of the stacked body 100 (the Z direction), penetrates through the stacked body 100 and reaches the substrate 10. Furthermore, the slit 91 extends in the depth direction on the paper (the X direction) and separates the stacked body 100 in the Y direction.

Figure 10:
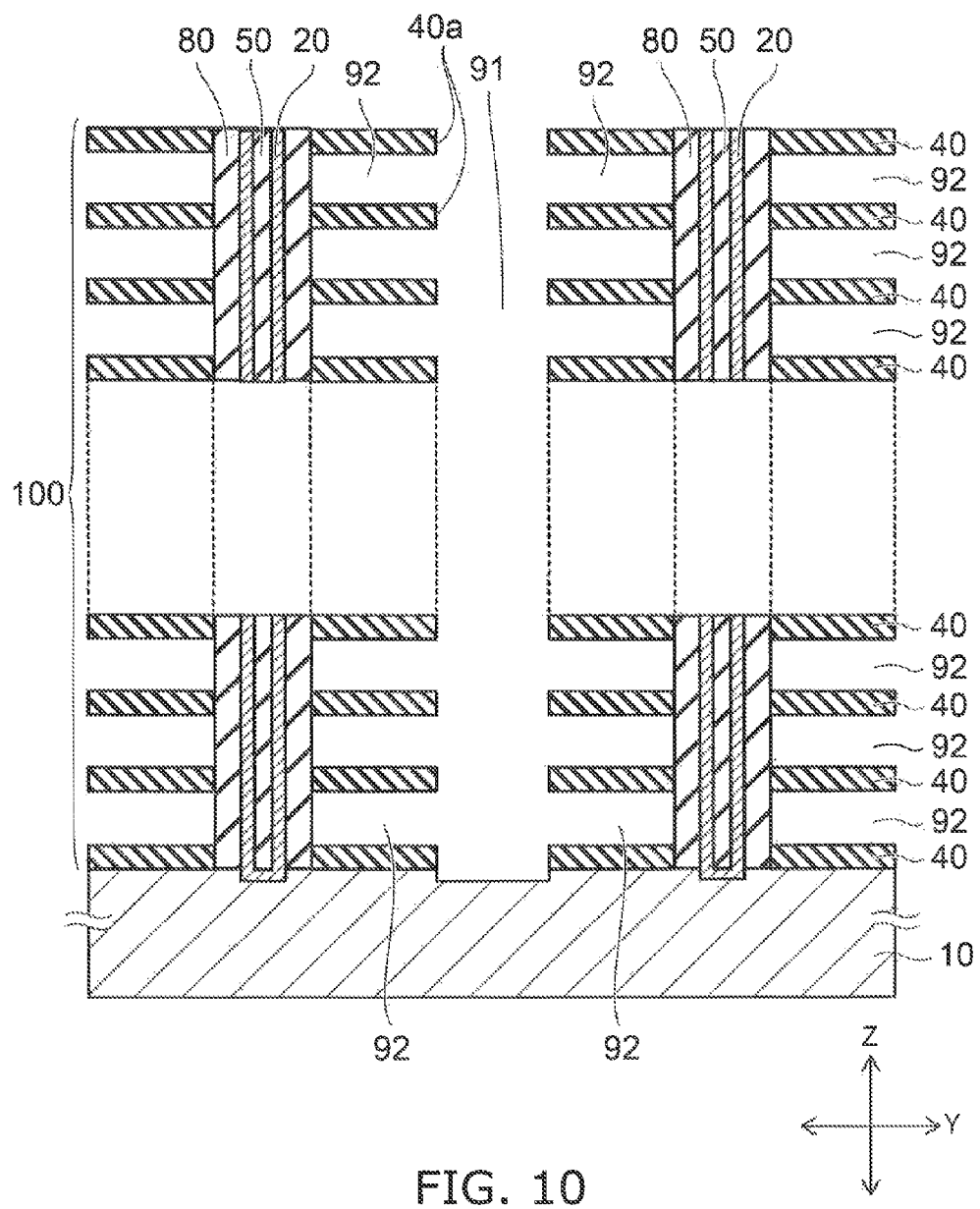
Figure 11:
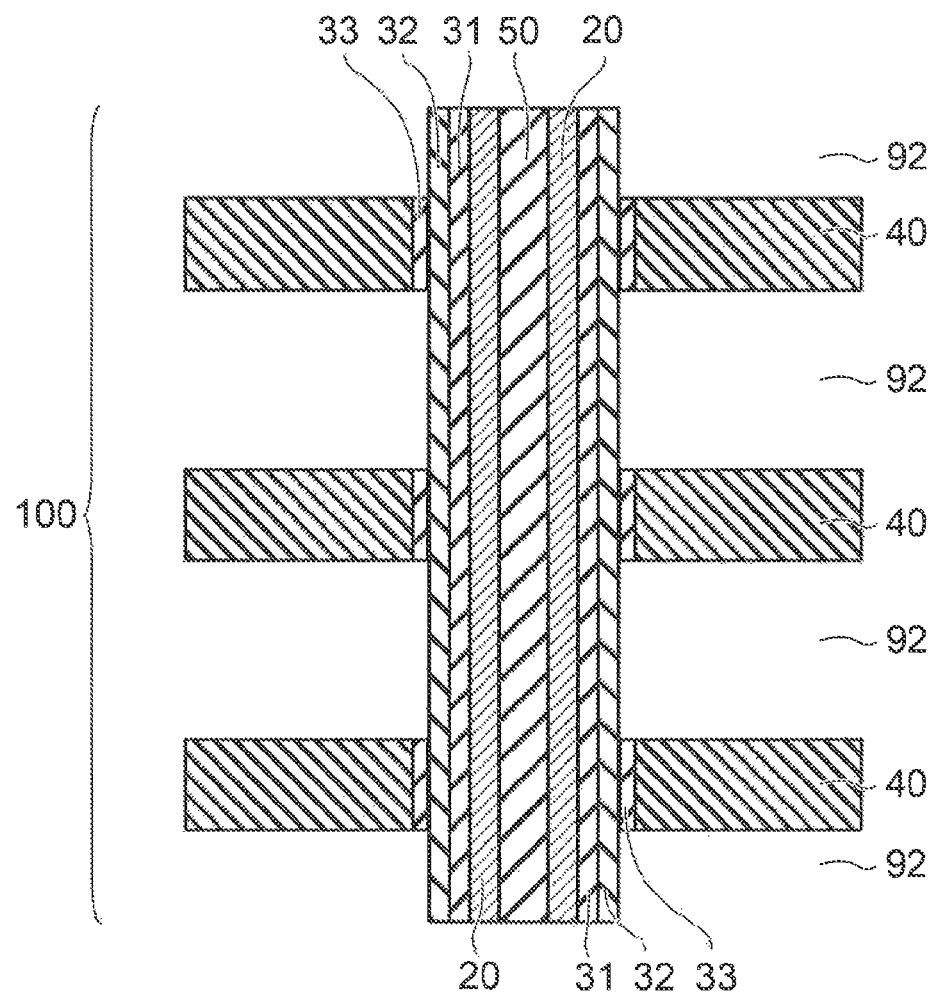

Next, the sacrificial layer 41 is removed by wet etching, for example, through the slit 91. The removal of the sacrificial layer 41 causes an air gap (or a space) 92 to be formed between the insulating layers 40, as illustrated in FIG. 10.

In addition, by wet etching, for example, a part of the cover dielectric film 33 is also removed. The cover dielectric film 33 that faces the air gap 92 is removed, as illustrated in the enlarged view in FIG. 11, and the charge storage film 32 is exposed to the air gap 92.

Figure 12:
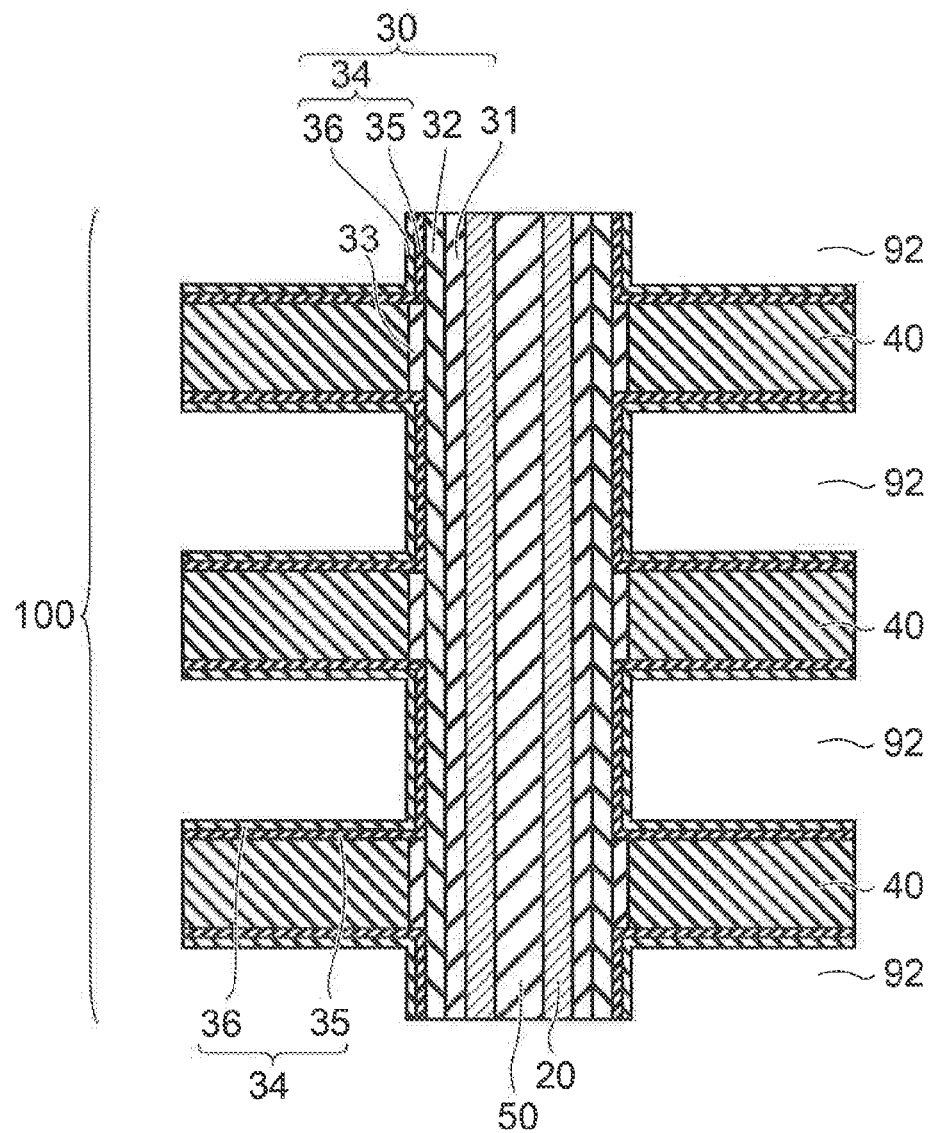

Next, as illustrated in FIG. 12, the block dielectric film 34 is formed on an inner wall of the air gap 92 by ALD, for example.

First, a silicon oxide film ($SiO_2$ film), for example, is conformally formed along the upper surface and the lower surface of the insulating layer 40 exposed to the air gap 92, and along the charge storage film 32, so as to be the first block film 35. Next, an aluminum oxide film ($Al_2O_3$ film), for example, is conformally formed along the first block film 35 on the inner side of the first block film 35, so as to be the second block film 36. After the block dielectric film 34 is formed, high-temperature heat treatment is performed in order to improve the quality of the dielectric film.

Figure 13:
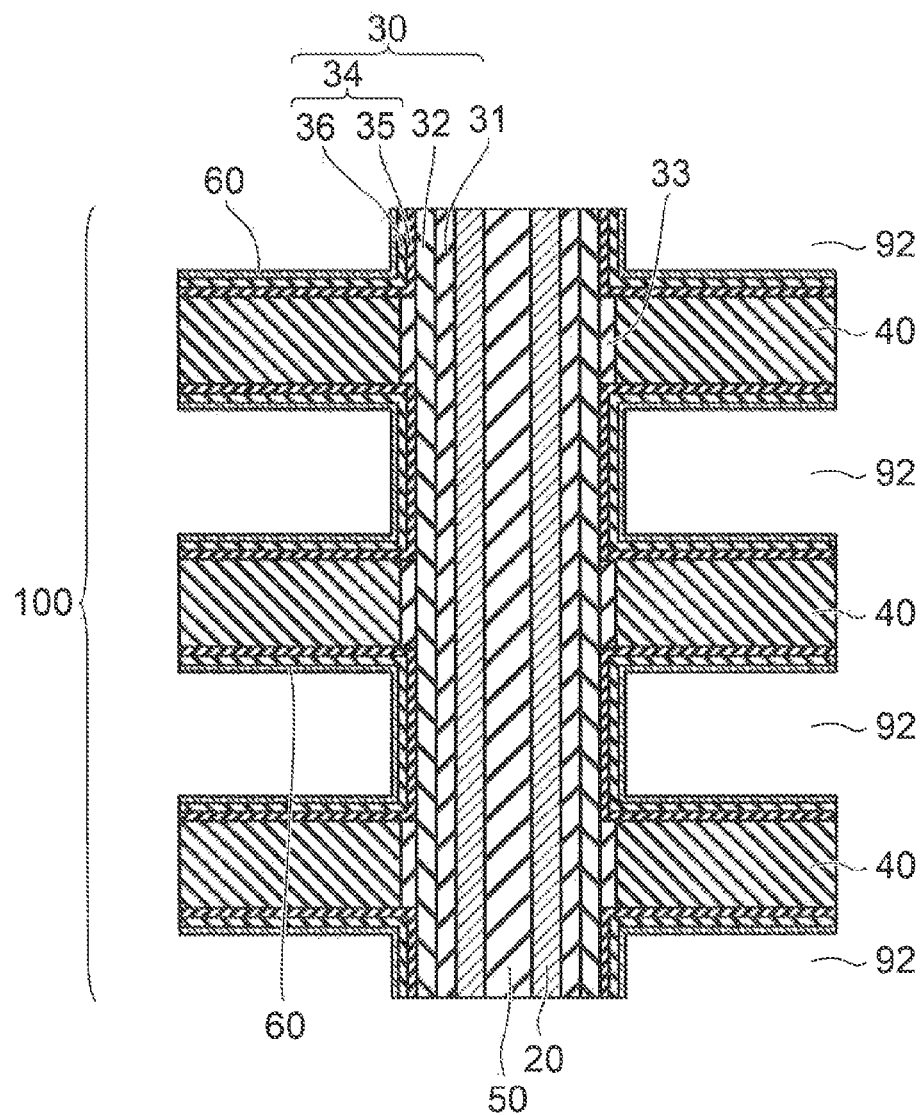

Next, the nitride film 60 is formed by ALD, for example, on the inner side of the second block film 36, as illustrated in FIG. 13.

Figure 14:
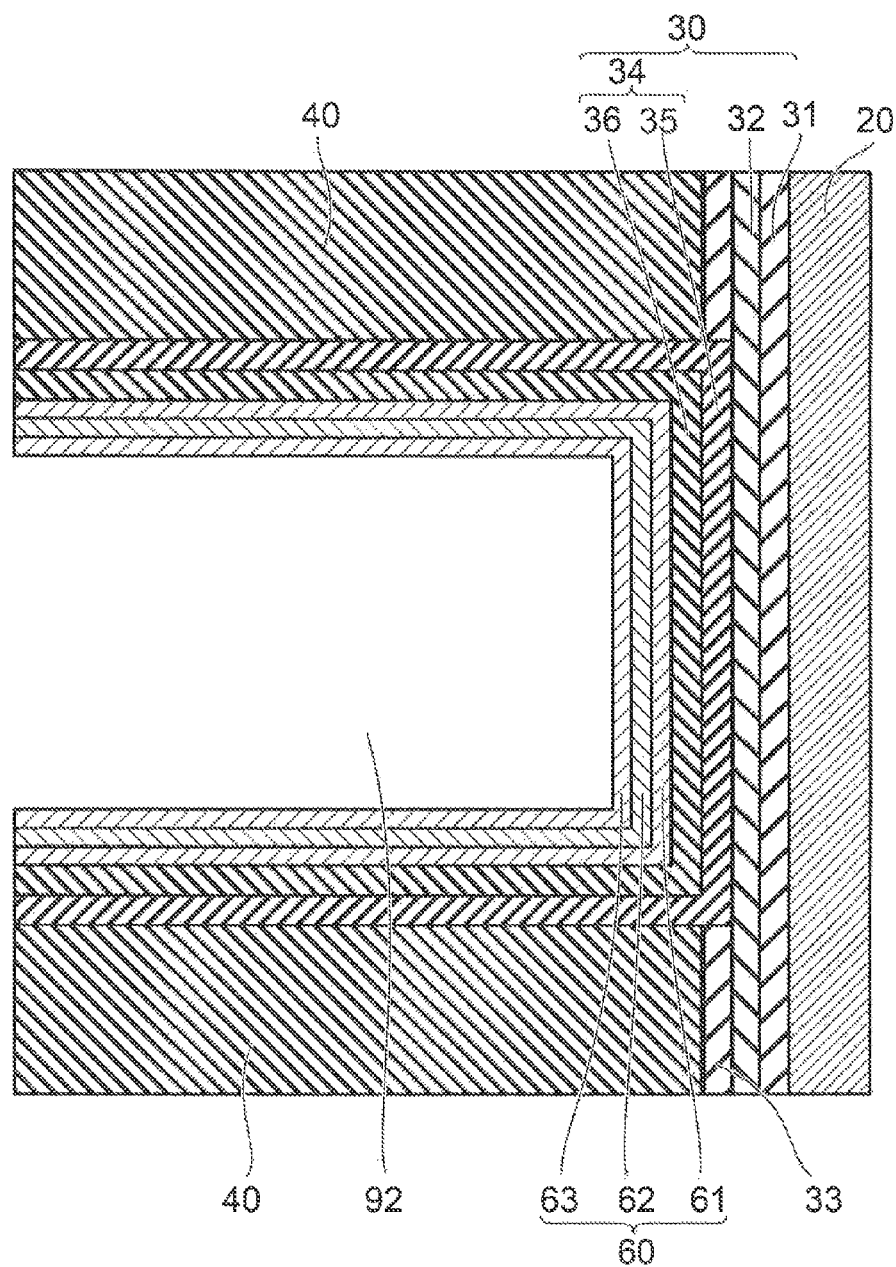

As illustrated in FIG. 14, which is an enlarged view of a section in FIG. 13, the first titanium nitride film (TiN film) 61 is conformally formed on the inner side of and along the second block film 36.

Next, a silicon nitride film (SiN film) or an aluminum nitride film (AlN film), for example, is conformally formed on the inner side of and along the first titanium nitride film 61, so as to be the amorphous nitride film 62.

Next, the second titanium nitride film (TiN film) 63 is conformally formed on the inner side of and along the amorphous nitride film 62.

The air gap 92 remains on the inner side of the second titanium nitride film 63. The metal layer 70 is formed inside the air gap 92.

A tungsten layer or a molybdenum layer, for example, is formed so as to be the metal layer 70 by CVD. At the time of performing the CVD, a source gas for film forming enters into the air gap 92 through the slit 91 illustrated in FIG. 10.

Adhesion of the tungsten layer or the molybdenum layer formed by CVD to the insulating layer 40, the block dielectric film 34, and the like is low. However, according to the embodiment, the metal layer (the tungsten layer or the molybdenum layer) 70 is formed by CVD on the titanium nitride film (the second titanium nitride film 63) that has a metal crystal structure, thereby making it possible to form the metal layer 70 having high adhesion to the base material (the second titanium nitride film 63).

A process of forming the tungsten layer so as to be the metal layer 70 by CVD, for example, includes a process of forming, on a surface of the second titanium nitride film 63, an initial film of low crystalline tungsten or microcrystalline tungsten, and a process of forming, on the inner side of the initial film, a large grain size tungsten film that is thicker than the initial film.

Figure 15:
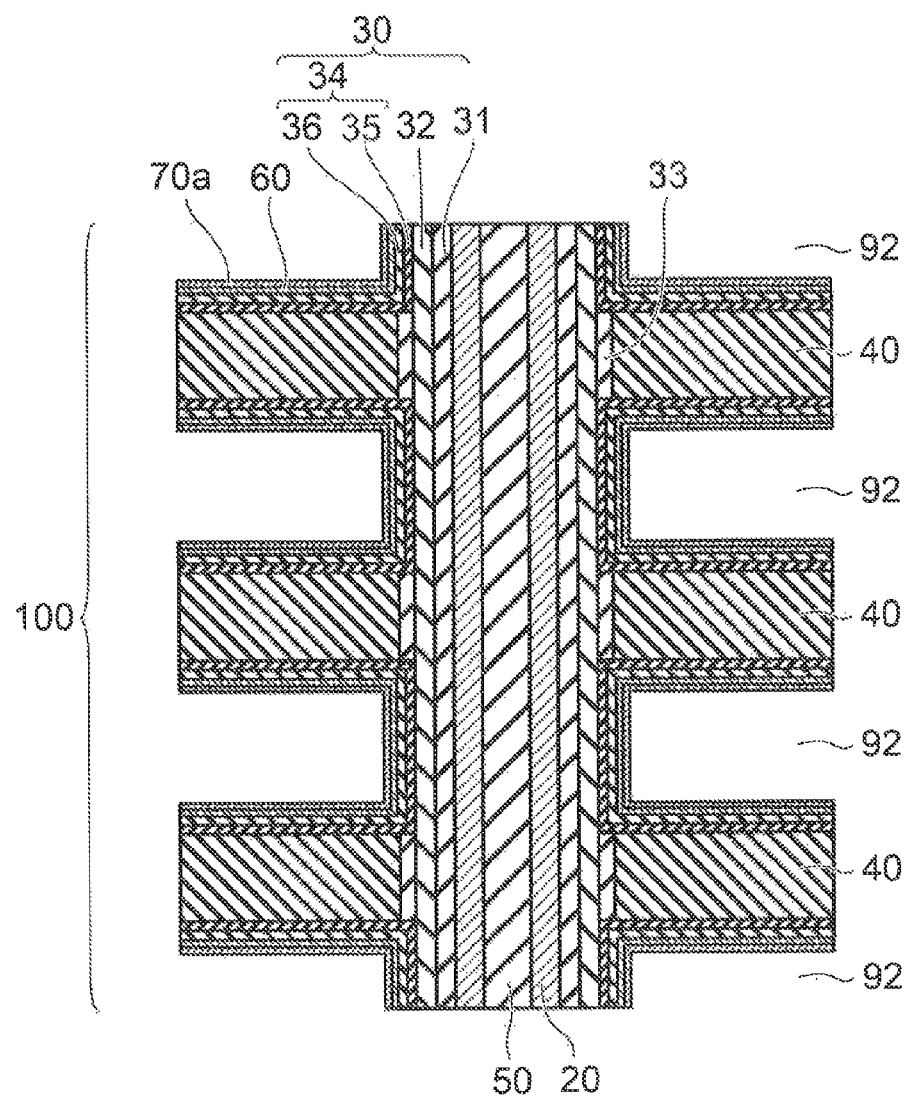

The initial film is formed by a reaction between tungsten hexafluoride ($WF_6$) gas which is the source gas of tungsten, and diborane ($B_2H_6$) gas as a reducing source gas. The initial film contains boron in addition to the metal (tungsten). As illustrated in FIG. 15, an initial film 70a is conformally formed along the surface of the second titanium nitride film 63 of the nitride film 60. A film thickness of the initial film 70a is 2 nm, for example.

Figure 16:
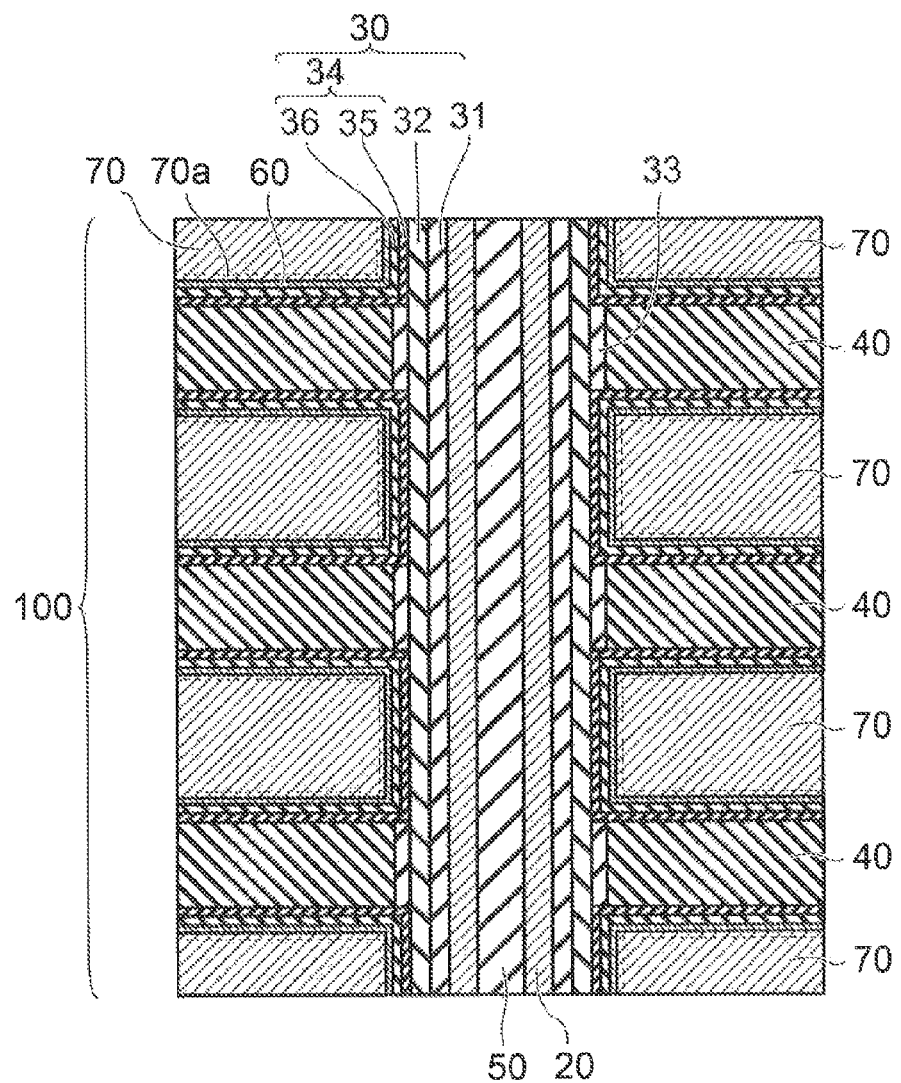

After that, as illustrated in FIG. 16, a tungsten layer is formed on the inner side of the initial film 70a by a reaction between $WF_6$ gas and hydrogen ($H_2$) gas as a reducing source gas. The metal layer 70 that is the tungsten layer is buried in the air gap 92. Boron that derives from the reducing source gas ($B_2H_6$ gas) at the time of forming the initial film 70a is contained in the vicinity of an interface between the metal layer 70 and the nitride film 60.

Alternatively, a molybdenum layer may be formed by CVD so as to be the metal layer 70 that also includes the initial film 70a. There are cases in which boron is also contained in the molybdenum layer, caused by gases at the time of performing the CVD.

At the time of initial film formation of the metal layer 70, the initial film 70a is formed on the surface of the second titanium nitride film 63, thereby making it possible to divide the crystallinity of tungsten or molybdenum formed on the inner side of the initial film 70a and the crystallinity of the second titanium nitride film 63, and preventing the crystallinity of the second titanium nitride film 63 from influencing the crystallinity of the metal layer 70. This promotes a larger grain size of the tungsten or the molybdenum due to the $H_2$ reduction reaction and lowers the resistivity of the metal layer 70.

Boron is taken into the initial film 70a formed by the $B_2H_6$ reduction reaction, and there is concern that, in a heat treatment after the formation of the metal layer 70, the boron may be diffused to the block dielectric film 34 and cause a deterioration in the characteristics of the block dielectric film 34.

The deterioration of the block dielectric film 34 due to the boron diffusion causes an increase in electron leakage from the metal layer 70 side, and makes it difficult to achieve a desired threshold change in erasing operation.

It should be noted that, as boron easily bonds with nitrogen, a nitride film, such as a titanium nitride film (TiN film), can be used as an effective barrier layer to inhibit the diffusion of the boron. However, the boron may pass through the titanium nitride film, by moving along the crystal grain boundaries of the crystallized titanium nitride film.

According to the embodiment, the amorphous nitride film 62 is interposed between the metal layer 70 and the block dielectric film 34. In the amorphous nitride film 62 that does not have grain boundaries, the diffusion of the boron via the grain boundaries does not occur, and the diffusion of the boron from the metal layer 70 to the block dielectric film 34 can be inhibited by the amorphous nitride film 62.

The silicon nitride film (SiN film) or the aluminum nitride film (AlN film) formed so as to be the amorphous nitride film 62 has extremely high thermal stability, and is not likely to undergo crystallization, and Si or Al diffusion even when subject to a thermal load in a following process.

However, if the amorphous nitride film 62 (the SiN film or the AlN film) is directly formed on the block dielectric film 34, Si or Al is easy to diffuse to the block dielectric film 34 at the time of forming the amorphous nitride film 62. This results in a low dielectric constant of the second block film (the aluminum oxide film) 36. Furthermore, oxygen contained in the aluminum oxide film of the second block film 36 may bond with the Si or the Al of the amorphous nitride film 62, thus causing a deterioration in the quality of the dielectric film due to an oxygen deficiency or the like.

According to the embodiment, the first titanium nitride film 61 is interposed between the second block film 36 and the amorphous nitride film 62. The first titanium nitride film 61 inhibits the diffusion of Si or Al to the second block film (the aluminum oxide film) 36 in the formation of the amorphous nitride film (the SiN film or the AlN film) 62.

Furthermore, the second titanium nitride film 63 is interposed between the amorphous nitride film 62 and the metal layer 70. As a result, in comparison to a case in which the metal layer 70 is directly formed on the amorphous nitride film 62, it is possible to increase adhesion between the metal layer 70 and the second titanium nitride film 63.

The first titanium nitride film 61 and the second titanium nitride film 63 are conductive films. The second titanium nitride film 63 provided in contact with the metal layer 70 can function as a control gate of the memory cell MC, along with the metal layer 70.

Meanwhile, the amorphous nitride film 62 that is the SiN film or the AlN film, is an dielectric film. The amorphous nitride film 62 is formed in the air gap 92 from which the sacrificial layer 41 has been removed, and the metal layer 70 is further formed in the air gap 92. Thus, if the film thickness of the amorphous nitride film 62 that is the dielectric film is made thicker, the height of the air gap 92 remaining on the inner side of the amorphous nitride film 62 becomes accordingly smaller. This inhibits an increase in the thickness of the conductive layer (the second titanium nitride film 63 and the metal layer 70) formed in the air gap 92, namely, inhibits the resistance of the control gate from becoming lower. It is desirable that the film thickness of the amorphous nitride film 62 be not more than 1 nm, for example.

As described above, according to the embodiment, the amorphous nitride film 62 is provided between the metal layer 70 and the block dielectric film 34, thereby suppressing a deterioration in the characteristics of the block dielectric film 34 caused by diffusion of boron contained in the metal layer 70 and securing a desired threshold variation of the memory cell MC.

The source gas of the metal layer 70 enters into the air gap 92 through the slit 91 illustrated in FIG. 10. At that time, the material film (the metal film) of the metal layer 70 is also formed by deposition on a side surface 40*a* (illustrated in FIG. 10) of the insulating layer 40 that is exposed to the slit 91. After that, the metal film of the side surface 40*a* of the insulating layer 40 is removed, thus blocking a short circuit between different layers of the metal layer 70 through the metal film.

In addition, the nitride film 60 conformally formed along the inner wall of the air gap 92 is further formed on the side surface 40*a* of the insulating layer 40, and different layers of the nitride film 60 are continuous to each other via the parts formed on the side surface 40*a* of the insulating layer 40. The nitride film 60 includes the conductive films (the first titanium nitride film 61 and the second titanium nitride film 63), and the second titanium nitride film 63 is in contact with the metal layer 70. Thus, through the second titanium nitride film 63, the different layers of the metal layer 70 are caused to short-circuit. Here, the nitride film 60 formed on the side surface 40*a* of the insulating layer 40 is also removed, and connecting of the nitride film 60 in the vertical direction (the stacking direction) is thus divided. In this manner, a short circuit between the different layers of the metal layer 70 via the nitride film 60 is blocked.

After that, as illustrated in FIG. 2, the conductive member LI is formed inside the slit 91, via the dielectric film 42. The dielectric film 42 is conformally formed on the side surface of and the bottom of the slit 91. The dielectric film 42 on the bottom of the slit 91 is removed by RIE, for example, and the substrate 10 is exposed to the bottom of the slit 91. After that, the conductive member LI is formed on the inner side of the dielectric film 42 inside the slit 91, and the bottom end of the conductive member LI is in contact with the substrate 10. Further, after that, the bit lines BL and the source layer SL illustrated in FIG. 1 are formed.

Figure 17:
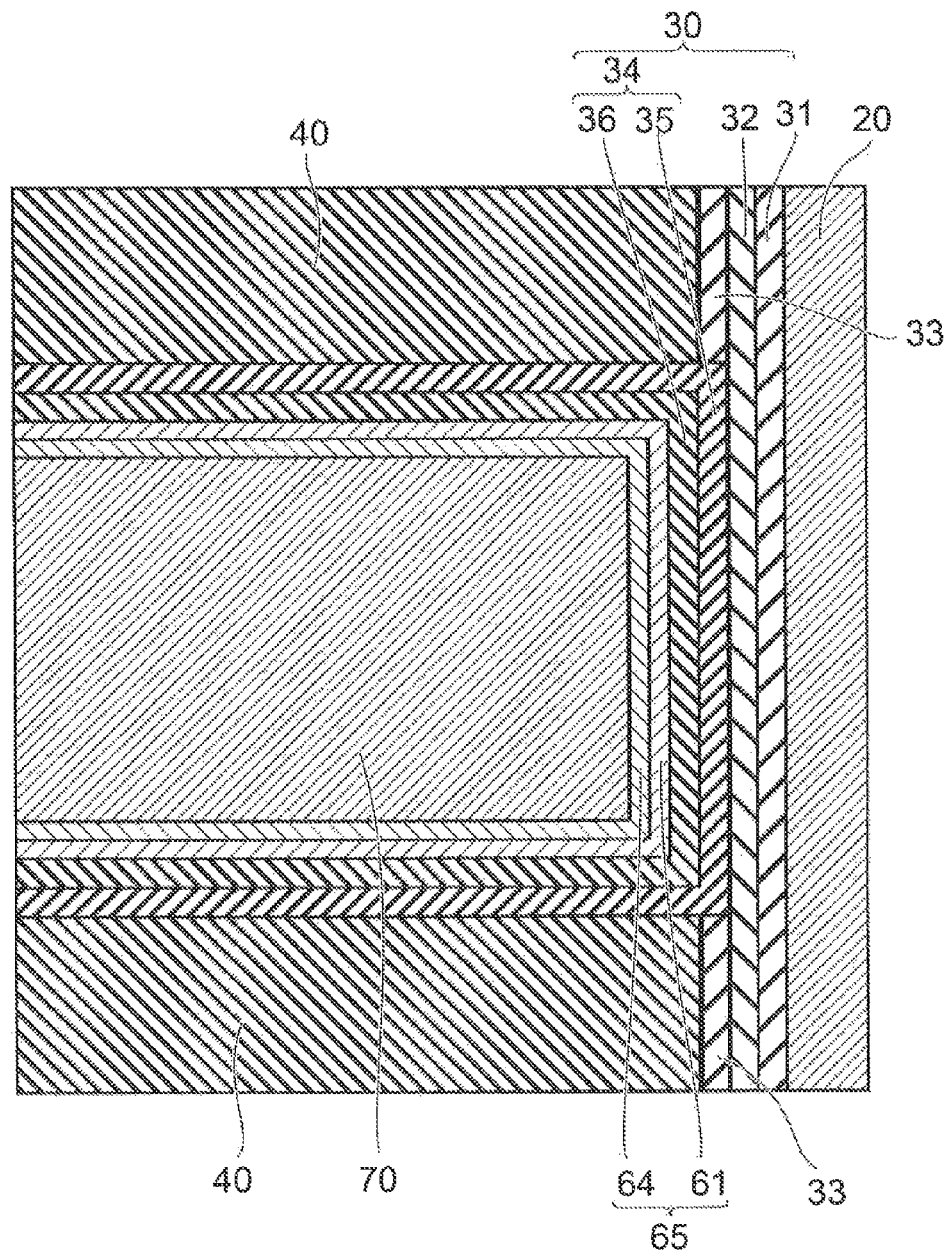
FIG. 17 is an enlarged cross-sectional view of a section of the semiconductor device of the embodiment.

FIG. 17 is a schematic cross-sectional view similar to FIG. 4, illustrating another specific example of a nitride film.

According to the example illustrated in FIG. 17, a nitride film 65 is provided between the metal layer 70 and the block dielectric film 34. The nitride film 65 has the first titanium nitride film 61 and the amorphous nitride film 64. The amorphous nitride film 64 is a titanium silicon nitride film (TiSiN film) or a titanium aluminum nitride film (TiAlN film), for example.

Similarly to the example illustrated in FIG. 4, the first titanium nitride film 61 is provided along the second block film 36 between the metal layer 70 and the charge storage film 32, and between the metal layer 70 and the insulating layer 40, and is in contact with the second block film 36.

The amorphous nitride film 64 is provided along the first titanium nitride film 61 between the metal layer 70 and the first titanium nitride film 61, and is in contact with the metal layer 70 and the first titanium nitride film 61.

Also in the example illustrated in FIG. 17, the amorphous nitride film 64 is interposed between the metal layer 70 and the block dielectric film 34. In the amorphous nitride film 64 that does not have grain boundaries, diffusion of boron via the grain boundaries does not occur, and the diffusion of the boron from the metal layer 70 to the block dielectric film 34 can be inhibited by the amorphous nitride film 64. A deterioration in the characteristics of the block dielectric film 34 caused by the diffusion of boron is suppressed, thereby making it possible to secure a desired threshold variation of the memory cell MC.

The titanium silicon nitride film (TiSiN film) or the titanium aluminum nitride film (TiAlN film) formed so as to be the amorphous nitride film 64 has extremely high thermal stability, and is not likely to undergo crystallization, and Si or Al diffusion even when subject to a thermal load in a following process.

Furthermore, the first titanium nitride film 61 interposed between the second block film 36 and the amorphous nitride film 64 inhibits the diffusion of Si or Al to the second block film (the aluminum oxide film) 36 in the formation of the amorphous nitride film 64.

Adhesion of the titanium silicon nitride film (TiSiN film) or the titanium aluminum nitride film (TiAlN film) to the tungsten layer or the molybdenum layer is high. Thus, the metal layer 70, which also includes the initial film 70*a*, can be directly formed on the amorphous nitride film 64.

In the nitride film 60 illustrated in FIG. 4 that includes the first titanium nitride film 61, the amorphous nitride film 62, and the second titanium nitride film 63, in order to secure the continuity of each of the films 61, 62, and 63, each of the films 61, 62, and 63 is formed having not less than a certain film thickness. For example, the film thickness of each of the film 61, the film 62, and the film 63 is 1 nm, and the film thickness of the nitride film 60 as a whole is 3 nm.

Also in the nitride film 65 illustrated in FIG. 17, in order to secure the continuity of each of the films 61 and 64, the film thickness of each of the film 61 and the film 64 is 1 nm, for example, and the film thickness of the nitride film 65 as a whole is 2 nm.

In this manner, the nitride film 65 having the configuration illustrated in FIG. 17 can be formed to be thinner than the nitride film 60 having the configuration illustrated in FIG. 4. The metal layer 70 can be made thicker as the nitride film 65 is made thinner, making it possible to lower the resistance of the metal layer 70.

The first titanium nitride film 61 and the titanium silicon nitride film (the TiSiN film) as the amorphous nitride film 64 are formed by ALD, for example, using titanium chloride (TiCl$_4$) gas, silane (SiH$_4$) gas, and ammonia (NH$_3$) gas.

First, the TiCl$_4$ gas and the NH$_3$ gas are alternately introduced into a film forming chamber, and the first titanium nitride film 61 is formed having a thickness of 1 nm, for example, on the surface of the second block film 36. After that, the titanium silicon nitride film (the TiSiN film) is formed so as to be the amorphous nitride film 64 having a thickness of 1 nm, for example, on the surface of the first titanium nitride film 61, by a process of introducing the $NH_3$ gas after the $TiCl_4$ gas is introduced, and a process of introducing the $NH_3$ gas after the $SiH_4$ gas is introduced.

After the memory hole MH illustrated in FIG. 6 is formed in the stacked body 100, the block dielectric film 34 may be formed on the side walls of the memory hole MH. The charge storage film 32, the tunnel dielectric film 31, and the semiconductor film 20 may be formed, in order, on the inner side of the block dielectric film 34. After that, the sacrificial layer 41 is removed, and the nitride film 60 is formed inside the air gap 92 formed by the removal of the sacrificial layer 41. The nitride film 60 is formed on the second block film 36 of the block dielectric film 34 exposed to the side surface of the air gap 92.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   a metal layer containing boron;
   a semiconductor film extending in a direction intersecting with a direction in which the metal layer extends;
   a charge storage film provided between the semiconductor film and the metal layer;
   a first dielectric film provided between the charge storage film and the metal layer; and
   a nitride film provided between the first dielectric film and the metal layer,
   the nitride film including
      a first titanium nitride film provided in contact with the first dielectric film,
      a second titanium nitride film provided in contact with the metal layer, and
      an amorphous nitride film provided between the first titanium nitride film and the second titanium nitride film.

2. The device according to claim 1, wherein the amorphous nitride film is one of a silicon nitride film and an aluminum nitride film.

3. The device according to claim 1, wherein
   a plurality of metal layers are stacked between a plurality of insulating layers, and
   the semiconductor film extends inside a stacked body including the plurality of metal layers and the plurality of insulating layers, in a stacking direction of the stacked body.

4. The device according to claim 3, wherein the nitride film is further provided between the metal layer and the insulating layer.

5. The device according to claim 1, wherein the first dielectric film includes an aluminum oxide film provided in contact with the nitride film.

6. The device according to claim 1, wherein the metal layer contains at least one of tungsten and molybdenum.

7. A semiconductor device comprising:
   a metal layer containing boron;
   a semiconductor film extending in a direction intersecting with a direction in which the metal layer extends;
   a charge storage film provided between the semiconductor film and the metal layer;
   a first dielectric film provided between the charge storage film and the metal layer; and
   a nitride film provided between the first dielectric film and the metal layer,
   the nitride film including
      a titanium nitride film provided in contact with the first dielectric film, and
      an amorphous nitride film provided between the titanium nitride film and the metal layer, the amorphous nitride film containing titanium, an element different to titanium, and nitrogen.

8. The device according to claim 7, wherein the amorphous nitride film is one of a titanium silicon nitride film and a titanium aluminum nitride film.

9. The device according to claim 7, wherein
   a plurality of metal layers are stacked between a plurality of insulating layers, and
   the semiconductor film extends inside a stacked body including the plurality of metal layers and the plurality of insulating layers, in a stacking direction of the stacked body.

10. The device according to claim 9, wherein the nitride film is further provided between the metal layer and the insulating layer.

11. The device according to claim 7, wherein the first dielectric film includes an aluminum oxide film provided in contact with the nitride film.

12. The device according to claim 7, wherein the metal layer contains at least one of tungsten and molybdenum.

* * * * *